United States Patent [19]

Devecchi et al.

[11] Patent Number: 4,952,885
[45] Date of Patent: Aug. 28, 1990

[54] MOS STAGE WITH HIGH OUTPUT RESISTANCE PARTICULARLY FOR INTEGRATED CIRCUITS

[75] Inventors: Daniele Devecchi, Desio; Guido Torelli, S. Alessio, both of Italy

[73] Assignee: SGS-Thomson Microelectronics srl, Milan, Italy

[21] Appl. No.: 311,287

[22] Filed: Feb. 15, 1989

[30] Foreign Application Priority Data

Mar. 28, 1988 [IT] Italy .................. 19991 A/88

[51] Int. Cl.$^5$ .............................................. H03F 3/45
[52] U.S. Cl. .................................. 330/277; 307/500; 307/501
[58] Field of Search .............. 307/585, 448, 475, 443, 307/450, 451, 360, 500, 501; 330/277

[56] References Cited

U.S. PATENT DOCUMENTS

| | | | |
|---|---|---|---|
| 3,739,194 | 6/1973 | Freeman et al. | 307/475 |
| 4,191,898 | 3/1980 | Ulmer | 307/475 |
| 4,568,844 | 2/1986 | O'Connor | 307/475 |
| 4,687,954 | 8/1987 | Yasuda et al. | 307/475 |
| 4,806,877 | 2/1989 | Kobayashi | 330/277 |
| 4,835,423 | 5/1984 | de Ferron et al. | 307/448 |

OTHER PUBLICATIONS

IEEE Journal of Solid-State Circuits, vol. SC-17, No. 6, Dec., 1982, Gray and Meyer: MOS OP Design—An Overview, pp. 977-978.
Analysis and Design of Analog Integrated Circuits, Second Edition, c. 1977, 1984; Gray and Meyer, pp. 711-714.
CMOS Analog Circuit Design, 1987, Allen and Holberg, pp. 223, 282-283, 296 and 421-426.

Primary Examiner—Stanley D. Miller
Assistant Examiner—T. Cunningham
Attorney, Agent, or Firm—Stevens, Davis, Miller & Mosher

[57] ABSTRACT

A first N-channel transistor (M1) and a second N-channel transistor (M2) are cascode connected and the source electrode of the first transistor is connected to the ground; a third P-channel transistor (M3) and a fourth P-channel transistor (M4) are also cascode connected, and the source of the fourth transistor is connected to a supply voltage; the drains of the second and third transistors (M2, M3) are mutually connected to act as output terminal. According to the invention, the absolute values of the threshold voltages of the second and third transistors are lower than the threshold voltages of the first and fourth transistors, and the gates of the first and second transistors are furthermore mutually connected to act as input terminal for a voltage signal, while the gates of said third and fourth transistors are mutually connected to act as input terminal for a bias voltage.

8 Claims, 2 Drawing Sheets

MOS STAGE WITH HIGH OUTPUT RESISTANCE PARTICULARLY FOR INTEGRATED CIRCUITS

BACKGROUND OF THE INVENTION

1. Field of the Invention

The present invention relates to a MOS stage with high output resistance, particularly for integrated circuits.

2. Prior Art

A stage with high output resistance is often useful in the manufacture of integrated circuits, for example to provide an amplifier stage with a high voltage gain value. An example of a known stage with high output resistance in widespread use to achieve a high voltage gain, is found in the "cascode" stage described for example in P. E. Allen and D. R. Holberg, CMOS Analog Circuit Design, published by Holt, Rinehart and Winston, 1987, ISBN 0-03-006587-9, pages 282-283).

A cascode stage of this type is illustrated in FIG. 1, wherein M1' and M2' are two N-channel MOS enhancement transistors; M3' and M4' are two P-channel MOS enhancement transistors; $V_{DD}$ is a positive supply voltage; $V_{REF1}$ and $V_{REF2}$ are two fixed voltages. The transistor M1' is the input transistor, and the input voltage signal $V_{IN}$ is applied to its gate electrode; the node between the transistors M2' and M3' is the output terminal OUT. The gate electrode of the transistor M4', connected to terminal A in FIG. 1, is often connected to a fixed bias voltage $V_{BIAS}$ which determines the value of the direct current flowing across the stage. As an alternative it can be connected to a voltage which is not fixed but "repeats" the input signal voltage $V_{IN}$, shifting its direct current value to an appropriate level (i.e. to the value required to correctly bias the stage). This second solution allows to obtain a higher overall voltage gain of the stage, since in practice it uses both the transistor M1' and the transistor M4' as input elements for the stage.

The output resistance of the above described stage is obviously equal to the parallel of the resistances opposed by the two paths which connect the output terminal OUT respectively to the power supply and to the ground. As can be calculated (see P. R. Gray and R. W. Meyer, Analysis and Design of Analog Integrated Circuits, published by John Wiley and Sons, 2nd edition, 1984, ISBN 0-471-87493-0, pages 711-714, or the previously mentioned book by Allen and Holberg, page 297) ignoring the terms due to the body effect for the sake of simplicity, these two resistances are respectively equal to $$r_{o3}(1 + g_{m3}r_{o1}) + r_{o4},$$

and $$r_{o2}(1 + g_{m2}r_{o1}) + r_{o4},$$

where $r_{oi}$ is the output resistance of the i-th transistor (Mi) and $g_{mi}$ is its respective transconductance. By first approximation ($g_{m1}r_{o1} >> 1$), these resistances are substantially equal to $r_{o3}r_{o4}g_{m3}$ and $r_{o2}r_{o1}g_{m2}$.

The advantage of the cascode stage is immediately apparent by observing that the resistance opposed by each of the two paths (which, in the absence of the cascode structure, would be equal to the output resistance $r_{o1}$ of the single transistor M4' or M1' present on said path) is multiplied by the factor $g_{m1}r_{o1}$ of the added transistor (M3' or M2').

As is known, for the correct operation of the amplifier stage all the transistors M1', . . . , M4' must operate in their saturation region. The output voltage of the cascode stage can thus assume, as maximum and minimum values respectively, approximately $V_{REF2} + |V_{th.p}|$, and $V_{REF1} - V_{th.n}$, where $V_{th.p}$ and $V_{th.n}$ respectively constitute the threshold voltages of the P-channel and N-channel transistors. Output voltage values $V_{OUT}$ beyond the interval defined by the indicated limits are incorrect, since in this case the transistor M2' (for values of $V_{OUT}$ lower than $V_{REF1} - V_{th.n}$) or the transistor M3' (for values of $V_{OUT}$ higher than $V_{REF2} + |V_{th.p}|$) would no longer operate in their saturation region. The output dynamics of the stage is this equal to $V_{REF2} - V_{REF1} + |V_{th.p}| + V_{th.n}$.

Naturally $V_{REF1}$ and $V_{REF2}$ are such that the two transistors M1' and M4' also operate always in their saturation region: in other words, the absolute value of the voltage $V_{DS}$ occurring between the drain electrode and the source electrode of each of said two transistors is always higher than $|V_{DSsat}|$, where $V_{DSsat}$ indicates the minimum modulus value of the voltage between the drain and the source of a saturated transistor (which naturally depends on the bias conditions of the transistor, in particular on the current flowing through it). To conclude, $V_{DSsat}$ is the minimum voltage between the drain and the source of a transistor which ensures that said transistor, under those bias conditions, is saturated. This voltage is termed hereafter transistor saturation drain-source voltage.

If an output dynamics equal to $V_{th.n} + |V_{th.p}|$ is sufficient, the gate electrodes of the two transistors M2' and M3' can be connected to the same fixed voltage $V_{REF}$ (in this case, naturally, the interval of values allowed for the output voltage of the stage is delimited by the values $V_{REF} - V_{th.n}$ and $V_{REF} + |V_{th.p}|$).

A disadvantage of the cascode stage resides in the fact that it is necessary to generate the two voltages $V_{REF1}$ and $V_{REF2}$ (these voltages being preferably generated internally to the integrated circuit in which the amplifier stage is included) and that it is necessary to have interconnection lines to transfer the two voltages $V_{REF1}$ and $V_{REF2}$ from the location where said voltages are generated (or from the pins at which they are applied to the circuit) to the gate electrodes of the two transistors M2' and M3'. This, besides entailing difficulties during design, also occupies silicon area and complicates the layout of the integrated circuit.

This disadvantage is reduced, but not eliminated, if a single reference voltage $V_{REF}$ is used; this, however, is not always possible.

Long interconnection lines can naturally be avoided by generating the voltages $V_{REF1}$ and $V_{REF2}$ on-the-spot at all the points of the circuit where they are required, but this, too, causes the disadvantage of occupying silicon area and dissipates power.

The folded cascode stage (see the aforementioned book by Allen and Holberg, pages 421-426, FIGS. 8.4-12 onwards: or the article by P. R. Gray and R. G. Meyer, MOS Operational Amplifier Design—A Tutorial Overview, published in IEEE Journal of Solid-State Circuits, vol. SC-17, No. 6, December 1982, pages 977-978 and FIG. 18) is an output stage structure which is based on the same concept described above and improves some of its operating characteristics. This structure, however, is more complicated than the simple cascode, and does not avoid the need for the two reference voltages $V_{REF1}$ and $V_{REF2}$.

SUMMARY OF THE INVENTION

The aim of the present invention is therefore to provide a stage with high output resistance, particularly for MOS circuits, requiring no referance voltages $V_{RFF}$ to operate, and having at the same time a compact layout and high dynamics.

The invention achieves the above described aim and other objects and advantages which will become apparent from the continuation of the description with a MOS stage with high output resistance, particularly for integrated circuits, comprising a first transistor and a second transistor with identical polarity, connected in series, said first transistor having its source electrode connected to a first pole of a supply voltage generator, said second transistor having its drain electrode connected to a terminal of a load which has its opposite terminal connected to an output terminal of the stage, characterized in that the absolute value of the threshold voltage of the second transistor is lower than the threshold voltage of the first transistor, and in that the gate electrodes of said first and second transistors are mutually connected and are also connected to a first input terminal.

According to a further characteristic of the invention, a branch is inserted between said output terminal and a second pole of the supply voltage generator and is constituted by a third transistor and a fourth transistor of an equal polarity opposite to the polarity of said first and second transistors; said third and fourth transistors are also connected in series and respectively have their drain electrode connected to said output terminal and their source electrode connected to the second pole of the supply voltage generator, the threshold voltage of the third transistor being lower than the threshold voltage of the fourth transistor, and the gate electrodes of said third and fourth transistors being mutually connected to act as input terminal for a second input voltage.

BRIEF DESCRIPTION OF THE DRAWINGS

The invention is now described in greater detail with reference to a preferred embodiment, illustrated in the accompanying drawings, which are given merely by way of non-limitative example, and wherein.

DETAILED DESCRIPTION OF THE PREFERRED EMBODIMENTS

Figure 1:
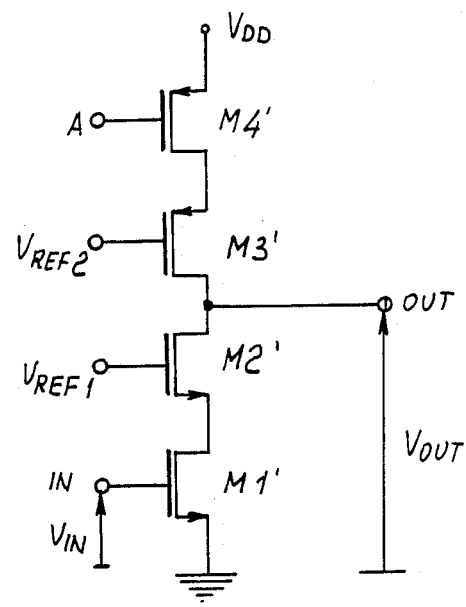
FIG. 1 is a circuit diagram of a cascode stage with high output resistance according to the prior art.
Figure 2:
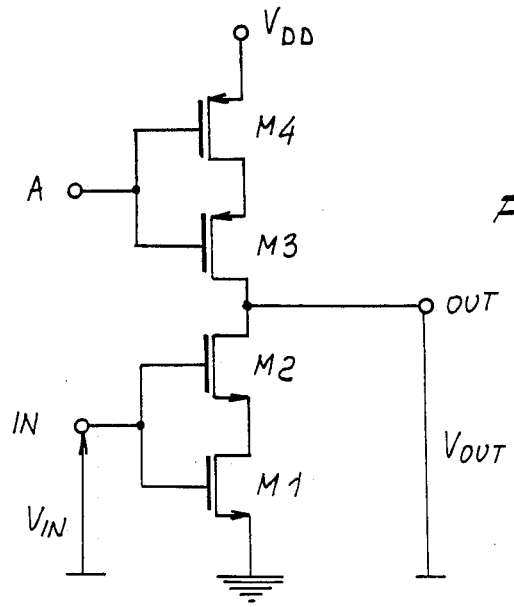
FIG. 2 is a circuit diagram of a stage with high output resistance according to a first preferred embodiment of the invention.

Like the conventional cascode, the circuit of FIG. 2 comprises two N-channel enhancement transistors M1, M2 connected in series, with the source electrode of M1 connected to the ground, and two P-channel enhancement transistors M3, M4, also connected in series, with the source electrode of M4 connected to a supply voltage $V_{DD}$ and with the drain electrodes of M2 and M3 connected in common to act as output terminal OUT.

According to the invention, the absolute values of the threshold voltages $V_{th.n1}$ and $V_{th.p1}$ of the transistors M2 and M3 are lower than the threshold voltages $V_{th.n}$, $V_{th.p}$ of the transistors M1, M4.

The gates of the two transistors M1 and M2 are mutually connected to act as input terminal for an input voltage signal $V_{IN}$, while the gates of the two transistors M3 and M4 are mutually connected to a terminal A which can be connected to a fixed bias voltage $V_{BIAS}$ or to a voltage which varies and "repeats" the input signal voltage $V_{IN}$ shifted by such a direct voltage value as to give the stage the correct bias. As already described for the known cascode stage, and as will become better apparent hereafter, this second solution allows a higher overall voltage gain in the stage.

Figure 3:
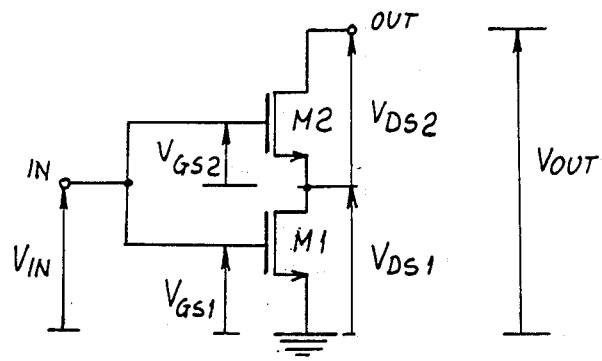
FIG. 3 is an auxiliary circuit diagram of a second simplified embodiment of a stage with high output resistance according to the invention.

In order to explain the operation of the circuit according to the invention, reference is initially made to the partial circuit illustrated in FIG. 3, which comprises only the portion of the circuit composed of the transistors M1 and M2.

As is known, the voltage $V_{GS}$ between the gate electrode and the source electrode of a transistor can be divided in two terms, according to the relation:

$$V_{GS} = V_{th} + V_{OV}, \qquad (2)$$

where $V_{OV}$ (the overdrive voltage) is the voltage in excess of the threshold voltage $V_{th}$ required to have a given current flow across the transistor (see for example the above mentioned book by Allen and Holberg, page 223, formula (8), where $V_{OV}$ is denoted as $\Delta V$). If $V_{OV1}$ and $V_{OV2}$ respectively denote the overdrive voltages of the transistors M1 and M2, the following relations can be written:

$$V_{IN} = V_{GS1} = V_{th.n} + V_{OV1} \qquad (3a)$$

$$V_{IN} = V_{GS2} + V_{DS1} = V_{th.n1} + V_{OV2} + V_{DS1} \qquad (3b)$$

where $V_{DS1}$ is the voltage occurring between the drain electrode and the source electrode of the transistor M1. Thus:

$$V_{DS1} = V_{th.n} - V_{th.n1} + V_{OV1} - V_{OV2} \qquad (4)$$

Now assume $V_{OV1} \approx V_{OV2}$. This is very likely, since the two transistors are crossed by the same direct current and have the same electric characteristics, except for their threshold voltage (in an integrated circuit they may be provided in exactly the same manner, with the only exception of e.g. an ion implanting step intended to change the threshold of the transistor M2 while leaving the other electric characteristics substantially unchanged). One thus obtains:

$$V_{DS1} = V_{th.n} - V_{th.n1} \qquad (5)$$

If the difference between $V_{th.n}$ and $V_{th.n1}$ is higher than the value of the saturation voltage $V_{DSsat.n1}$ of the transistor M1, i.e. if $$V_{th.n}31\ V_{th.n1} > V_{DSsat.n1} \qquad (6a)$$

the transistor M1 operates at a drain-source voltage which is higher than the value $V_{DSsat.n1}$, so that it operates in its saturation region.

Similar considerations may be made for the transistor M4, provided that the following relation holds:

$$|V_{th.p} - V_{th.p1}| > |V_{DSsat.p4}| \qquad (6b)$$

where $V_{DSsat.p4}$ is the saturation voltage of the transistor M4.

The value of the output resistance of the stage according to the invention is easily determined.

Figure 4:
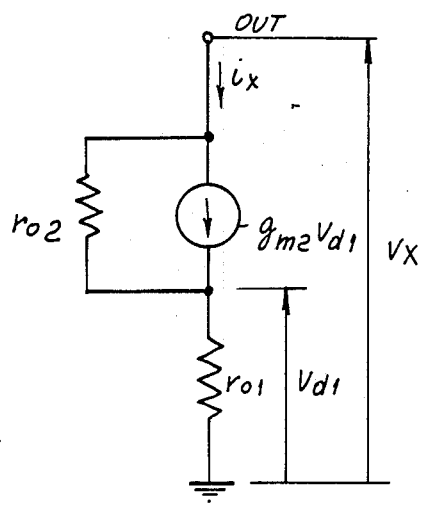
FIG. 4 is an equivalent diagram of the circuit according to FIG. 3.

FIG. 4 is an equivalent representation of the path across M2 and M1 between the output terminal OUT and the ground: assuming the terminal IN is shorted to the ground in terms of the signal and ignoring the body effect as usual, the following are obtained in succession from said figure:

$$v_x = v_{d1} + r_{o2}(i_x + g_{m2}v_{d1})$$

$$v_{d1} = r_{o1}i_x$$

$$v_x = r_{o1}i_x + r_{o2}(i_x + g_{m2}r_{o1}i_x)$$

$$v_x = r_{o1}i_x + i_x(r_{o2} + r_{o2}g_{m2}r_{o1})$$

$$v_x = i_x r_{o1} + r_{o2}(1 + g_{m2}r_{o1})\dot{e} \qquad (7)$$

The resistance R of this path, given by $v_x/i_x$, is therefore equal to:

$$R = r_{o2}(1 + g_{m2}r_{o1}) + r_{o1}.$$

Similarly, it can be calculated that the resistance $R'$ opposed by the "path" between the output terminal OUT and the power supply $V_{DD}$ is equal to:

$$R' = r_{o3}(1 + g_{m3}r_{o4}) + r_{o4}.$$

The value of the output resistance $R_{out}$ of the stage is obviously equal to the parallel of the resistances opposed by the two paths towards $V_{DD}$ and towards the ground, i.e.

$$1/R_{out} = 1/R + 1/R' \qquad (8)$$

which is exactly equal to the value of the output resistance of a cascode stage.

The modulus of the voltage gain $A_v$ of the stage of FIG. 2 is:

$$|A_v| = g_{m1}r_{out} \qquad (9)$$

If the input signal is also applied to the terminal A (after an appropriate level shift as described above), the modulus of the voltage gain of the stage becomes:

$$|A_v| = (g_{m1} + g_{m4})r_{out} \qquad (10)$$

The output voltage can assume all the values at which the transistors of the stage start to operate in their saturation region. The minimum value of the output voltage is therefore determined by the saturation condition of the transistors M1 and M2. Condition (6a) must be complied with for the transistor M1, and the output voltage must not drop below the following value for the transistor M2:

$$V_{DS1} + V_{DSsat.n2} = V_{th.n} - V_{th.n1} + V_{DSsat.n2}, \qquad (11)$$

which is therefore the minimum allowed value for the output voltage. Similarly, the maximum value is:

$$V_{DD} - (|V_{th.p} - V_{th.p1}|), \qquad (12)$$

and the output dynamics is determined by the difference between (11) and (12), i.e.

$$V_{DD} - (|V_{th.p} - V_{th.p1}|) - (V_{th.n} - V_{th.n1}) + |V_{DSsat.p3}| - V_{DSsat.n2}$$

This dynamics is very high, since the saturation voltage of the transistors is on the order of a few hundred mV, and the differences between the threshold voltages $V_{th.n}$ and $V_{th.n1}$ on one side and $V_{th.p}$ and $V_{th.p1}$ on the other required for the good operation of the stage is also on the order of a few hundred mV.

Though in the preferred example all the transistors have been chosen of the enhancement type, the transistors M2 and M3 can also be of the depletion type, the only condition being that they must have a low or even substantially nil threshold voltage, so that (6a, 6b) are complied with. It is also evident that the concepts of the invention may also be applied to the folded cascode stage as well as to the above described cascode stage. It is furthermore evident that the stage according to the invention can be provided with a negative supply voltage, inverting the transistor types between N-channel and P-channel.

Finally, it is naturally possible to obtain circuit structures in which only one of the two paths between the output terminal of the stage and the supply terminals (ground and $V_{DD}$) is executed according to the methods of the present invention.

Some preferred embodiments of the invention have been described, but it is naturally susceptible to modifications and variations which are obvious to the expert in the field, on the basis of the given teachings, without thereby abandoning the scope of the inventive concept resulting from the accompanying claims.

We claim:

1. An MOS amplifier stage with high output resistance, particularly for integrated circuits, comprising a first transistor and a second transistor (M1, M2) of identical polarity, connected in series, said first transistor (M1) having its source electrode connected to a first terminal of a supply voltage generator, said second transistor (M2) having its drain electrode connected to an output terminal of the stage and also to a load, wherein the absolute value of the threshold voltage of the second transistor is lower than the threshold voltage of the first transistor and the gate electrodes of said first and second transistors are mutually connected to form a first input terminal.

2. An MOS amplifier stage with high output resistance according to claim 1, wherein said first input terminal constitutes an input terminal for a voltage signal.

3. An MOS amplifier stage with high output resistance according to claim 1, wherein said first input terminal constitutes an input terminal for a fixed bias voltage.

4. An MOS amplifier stage with high output resistance, particularly for integrated circuits, comprising a first transistor and a second transistor (M1, M2) of identical polarity, connected in series, said first transistor (M1) having its source electrode connected to a first terminal of a supply voltage generator, said second transistor (M2) having its drain electrode connected to an output terminal of the stage and also to a load, wherein the absolute value of the threshold voltage of the second transistor is lower than the threshold voltage of the first transistor and the gate electrodes of said first and second transistors are mutually connected to form a first input terminal, wherein a branch is inserted between said output terminal (OUT) and a second terminal of the supply voltage generator ($V_{DD}$), said branch comprising a third transistor and a fourth transistor (M3, M4) of identical polarity, said polarity being opposite to that of said first and second transistors, said third and fourth transistors being also connected in series and having respectively a drain electrode connected to said output terminal and a source electrode connected to the second terminal of the supply voltage generator, the threshold voltage of the third transistor being lower than the threshold voltage of the fourth transistor, and the gate electrodes of said third and fourth transistors being mutually connected to form an input terminal for a second input voltage.

5. An MOS amplifier stage with high output resistance according to claim 4, wherein said bias voltage is fixed.

6. An MOS amplifier stage with high output resistance according to claim 4, wherein said bias voltage is variable around a fixed value with the same behavior as the input voltage signal.

7. An MOS amplifier stage with high output resistance according to claim 4, wherein said first, second, third and fourth transistors are all of the enhancement type.

8. An MOS amplifier stage with high output resistance according to claim 4, wherein said first and fourth transistors are of the enhancement type, while said second and third transistors are of the depletion type.

* * * * *